US006466417B1

(12) United States Patent
Gill

(10) Patent No.: US 6,466,417 B1
(45) Date of Patent: Oct. 15, 2002

(54) LAMINATED FREE LAYER STRUCTURE FOR A SPIN VALVE SENSOR

(75) Inventor: Hardayal Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/431,612

(22) Filed: Nov. 2, 1999

(51) Int. Cl.[7] .............................. G11B 5/127; G11B 5/33
(52) U.S. Cl. ................................................. 360/324.12
(58) Field of Search ............................. 360/324, 324.2, 360/325, 326, 327, 327.33, 328, 324.1, 327.1, 327.11, 327.2, 327.21, 327.22, 327.23, 327.24, 327.3, 327.31, 327.32, 324.12, 313, 110

(56) References Cited

U.S. PATENT DOCUMENTS

| | | | |
|---|---|---|---|
| 5,408,377 A | 4/1995 | Gurney et al. | 360/325 |
| 5,508,866 A * | 4/1996 | Gill et al. | 360/325 |
| 5,648,885 A | 7/1997 | Nishioka et al. | 360/324.12 |
| 5,654,854 A | 8/1997 | Mallary | 360/327.3 |
| 5,849,422 A | 12/1998 | Hayashi | 428/611 |
| 5,880,913 A | 3/1999 | Gill | 360/324.11 |
| 5,920,446 A * | 7/1999 | Gill | 360/324 |
| 6,125,019 A * | 9/2000 | Hoshiya | 360/324.1 |
| 6,175,476 B1 * | 1/2001 | Huai et al. | 360/324.11 |
| 6,178,074 B1 * | 1/2001 | Gill | 360/324.2 |

FOREIGN PATENT DOCUMENTS

JP      10-294217    11/1998

OTHER PUBLICATIONS

Saito et al, US PAP US 2001/0004307 A1, Jun. 2001.*
Nishioka et al., J. Appl. Phys. "GMR Properties of Spin Valves Using Multilayered $Co_{90}Fe_{10}$ for Free Magetic Layer", Apr. 15, 1996, pp. 4970–4972.

* cited by examiner

Primary Examiner—Robert S. Tupper
Assistant Examiner—Julie Anne Watko
(74) Attorney, Agent, or Firm—Brian C. Kunzler

(57) ABSTRACT

An improved free layer structure for a spin valve sensor achieves a high magnetoresistance with the use of multiple layers of a Co-Fe alloy. The improved free layer also achieves a high degree of softness by laminating and alternating the Co-Fe alloy layers with intervening layers of a metal alloy containing Ni and Fe and by limiting the thickness of the Co-Fe alloy layers to a thickness preferably of 10 Å or less. The intervening metal alloy layers may also comprise Co and/or materials with a high electrical resistance. The layer of Co-Fe alloy closest to a Cu spacer layer may be thicker than subsequent Co-Fe alloy layers. Preferred embodiments are comprised of alternating layers of $Co_{90}Fe$ and $Ni_{66}Fe_{16}Co_{18}$ in individual layer thicknesses of about seven Å, with the first layer of $Co_{90}Fe_{10}$ having a thickness of about 10 Å.

26 Claims, 4 Drawing Sheets

LAMINATED FREE LAYER STRUCTURE FOR A SPIN VALVE SENSOR

BACKGROUND OF THE INVENTION

1. The Field of the Invention

This invention relates generally to spin valve magnetic transducers for reading information signals from a magnetic medium and, in particular, to improvements in a free layer for a spin valve sensor, and to magnetic recording systems which incorporate such sensors.

2. The Relevant Technology

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect. In an SV sensor, one of the ferromagnetic layers, referred to as the pinned layer, has its magnetization typically pinned by exchange coupling with an antiferromagnetic (e.g., NiO or Fe-Mn) layer.

The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the SV sensor and a corresponding change in the sensed current or voltage. It should be noted that the AMR effect is also present in the SV sensor free layer and it tends to reduce the overall GMR effect.

FIG. 1 shows a typical SV sensor 100 comprising a pair of end regions 104 and 106 separated by a central region 102. The central region 102 is formed by a suitable method such as sputtering and has defined end regions that are contiguous with and abut the edges of the central region. A free layer (free ferromagnetic layer) 110 is separated from a pinned layer (pinned ferromagnetic layer) 120 by a non-magnetic, electrically-conducting spacer 115. The magnetization of the pinned layer 120 is fixed through exchange coupling with an antiferromagnetic (AFM) layer 121.

The free layer 110, spacer 115, pinned layer 120 and AFM layer 121 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current IS from a current source 160 to the MR sensor 100. A sensing device 170 connected to the leads 140 and 145 senses the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the SV effect.

Another type of spin valve sensor recently developed is an antiparallel (AP)-pinned spin valve sensor. FIG. 2 shows one representative AP-pinned SV sensor 200. The AP-pinned SV sensor 200 has a pair of end regions 202 and 204 separated from each other by a central region 206. The AP-pinned SV sensor 200 is also shown comprising a Ni-Fe free layer 225 separated from a laminated AP-pinned layer 210 by a copper spacer layer 220. The magnetization of the laminated AP-pinned layer 210 is fixed by an AFM layer 208 which is made of NiO.

The laminated AP-pinned layer 210 includes a first ferromagnetic layer 212 (PF1) of cobalt and a second ferromagnetic layer 216 (PF2) of cobalt separated from each other by a ruthenium (Ru) antiparallel coupling layer 214. The AFM layer 208, AP-pinned layer 210, copper spacer 220, free layer 225 and a cap layer 230 are all formed sequentially in the central region 206. A pair of hard bias layers 235 and 240, formed in the end regions 202 and 204, provide longitudinal biasing for the free layer 225.

A pair of electrical leads 245 and 250 are also formed in end regions 202 and 204, respectively, to provide electrical current from a current source (not shown) to the SV sensor 200. In the depicted example, the magnetization direction of the free layer 225 is set parallel to the air bearing surface (ABS) in the absence of an external field. The magnetization directions of the pinned layers 212 and 214, respectively, are also set to be perpendicular to the ABS. The magnetization directions of the pinned layers are shown as coming out of the Figure at 260 and going in at 255. The magnetization of the free layer 225 is shown set to be parallel to the ABS.

The disk drive industry has been engaged in an ongoing effort to increase the GMR coefficient of the SV sensors in order to store more and more bits of information on any given disk surface. The issue is somewhat complicated, however, by the need to maintain a high degree of softness of the SV sensors, as measured by coefficients $H_C$ and $H_K$.

The softness of a SV sensor is a measurement of the threshold level of a magnetic field needed to change the magnetoresistance of a material by a given amount, typically that required to move the magnetic moment of the material from one orientation to another, offset from the first by 90°.

The softness of a material is referred to as its coercivity, $H_C$, when the material exhibits domain walls, and more generally, by the property magnetocrystalline anisotropy, $H_K$. Softness is increasingly important as disk drive densities increase and the magnetic field strengths of the recorded materials correspondingly decrease.

A further property exhibited by materials used in the formation of spin valves is magnetostriction. Magnetostriction is a measure of the stress or deformation of a material when it undergoes a change in magnetism. It is desired in the construction of spin valves to keep magnetostriction to a minimum.

Certain materials exhibiting a high degree of magnetoresistance have been found to exhibit a corresponding undesirably low degree of softness (i.e., an $H_K$ of 15 Oe or greater). Such materials include Co-Fe. It would be desirable to provide a spin valve sensor with a high degree of magnetoresistance (for instance, a change in resistance of about 7% or greater when a flat filament is exposed to a field of 50 Oe) through the use of materials such as Co-Fe, but which also maintains a high level of softness. It would also be desirable to provide such a spin valve sensor that maintains a low magnetostriction.

OBJECTS AND BRIEF SUMMARY OF THE INVENTION

The apparatus of the present invention has been developed in response to the present state of the art, and in particular, in response to the problems and needs in the art that have not yet been fully solved by currently available spin valve sensors. Thus, it is an overall objective of the present invention to provide an improved spin valve sensor that overcomes some or all of the problems discussed above as existing in the art.

To achieve the foregoing object, and in accordance with the invention as embodied and broadly described herein in the preferred embodiments, a spin valve sensor with an improved free layer is provided. The spin valve sensor of the present invention in one embodiment comprises a free layer formed of a plurality of layers of a Co-Fe alloy and one or more intervening metal alloy layers containing at least Ni and Fe separating the plurality of layers of a Co-Fe alloy.

In alternate embodiments of the invention, the intervening metal alloy layers also comprise cobalt (Co). The intervening metal alloy layers may also comprise a metal selected from the group consisting of chromium, tantalum, rhodium, and molybdenum.

It is preferred that the layers of a Co-Fe alloy each have a thickness falling within a range of between about 2 Angstroms and about 15 Angstroms. A more preferred thickness is within a range of between about 5 Angstroms and about 10 Angstroms. Most preferably, the layers of a Co-Fe alloy each have a thickness of about 7 Angstroms. It is preferred that the free layer has a total thickness in a range of between about 20 Å and about 40 Å, and that the layers of a Co-Fe alloy comprise at least 3 layers.

The layers of a Co-Fe alloy and the intervening metal alloy layers may, in one embodiment, comprise a first layer of a Co-Fe alloy; a first layer containing Ni and Fe; a second layer of a Co-Fe alloy; a second layer containing Ni and Fe; and a third layer of a Co-Fe alloy. In a currently preferred embodiment, the layers of a Co-Fe alloy may comprise $Co_{90}Fe_{10}$, and the layers Ni and Fe may comprise $Ni_{81}Fe_{19}$ or $Ni_{66}Fe_{16}Co_{18}$.

In one further embodiment, the initial layer (closest to the spacer layer) of a Co-Fe alloy is substantially thicker than the subsequent layers of a Co-Fe alloy. For instance, an initial layer may have a thickness in a range of between 10 and 20 Å when the subsequent layers of a Co-Fe alloy have a thickness in a range of between about 2 and 10 Å. In a more specific example, the initial layer may have a thickness of about 10 Å, while the subsequent layers may have a thickness in a range of between about 5 Å to 7 Å.

The spin valve sensor may comprise a cap layer; a free layer configured in the manner discussed above; a spacer layer; a pinned layer of ferromagnetic material; and an antiferromagnetic (AFM) layer. Nevertheless, the free layer of the present invention is intended for use with any type of spin valve sensor having any suitable construction.

The spin valve sensor of the present invention may be incorporated within a disk drive system comprising a magnetic recording disk; an anti-parallel (AP)-pinned spin valve (SV) sensor configured in the manner discussed above; an actuator for moving said spin valve sensor across the magnetic recording disk so the spin valve sensor may access different regions of magnetically recorded data on the magnetic recording disk; and a detector electrically coupled to the spin valve sensor for detecting changes in resistance of the sensor caused by rotation of the magnetization axis of the free ferromagnetic layer relative to the fixed magnetizations of the AP-pinned layer in response to magnetic fields from the magnetically recorded data.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 3:
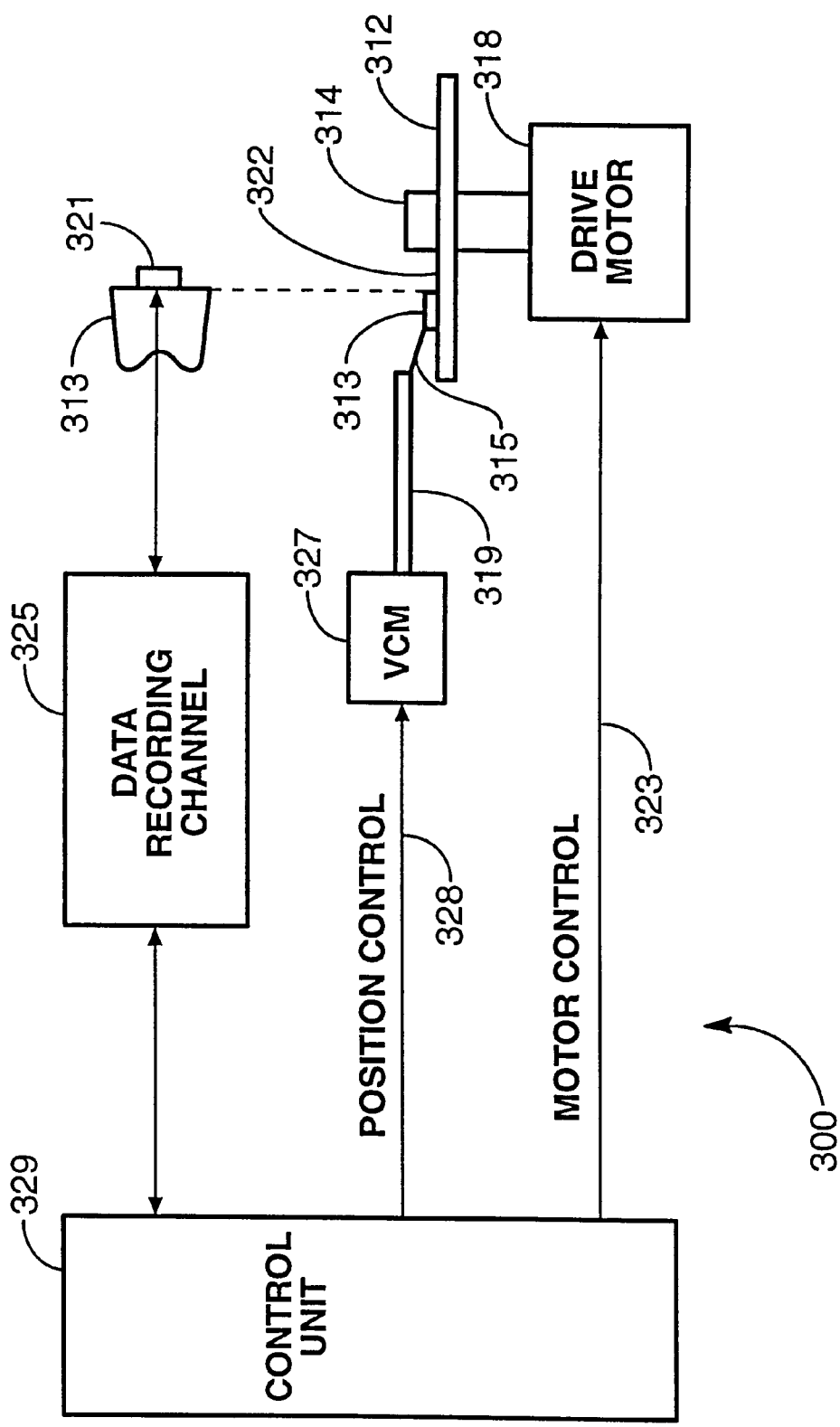
FIG. 3 is a schematic block diagram illustrating one embodiment of a magnetic recording disk drive system of the present invention.

FIG. 3 shows one example of a disk drive 300 embodying the present invention. As shown in FIG. 3, the disk drive 300 comprises at least one rotatable magnetic disk 312 supported on a spindle 314 and rotated by a disk drive motor 318. The magnetic recording media on each magnetic disk 312 is in the form of an annular pattern of concentric data tracks (not shown).

At least one slider 313 is positioned on the disk 312. Each slider 313 supports one or more magnetic read/write heads 321 incorporating the MR sensor of the present invention. As the disks rotate, the slider 313 is moved radially in and out over the disk surface 322 so that the heads 321 may access different portions of the magnetic disk 312 where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator means 327.

The actuator means as shown in FIG. 3 may be a voice coil motor (VCM). The VCM comprises a coil movable within a fixed magnetic field, the direction and speed of the coil movements being controlled by the motor current signals supplied by a controller 329.

During operation of the disk storage system, the rotation of the magnetic disk 312 generates an air bearing between the slider 313 (the surface of slider 313 which includes head 321 and faces the surface of disk 312 is referred to as an air bearing surface (ABS)) and disk surface 322 which exerts an upward force or lift on the slider 313. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the control unit 329, such as access control signals and internal clock signals. Typically, the control unit 329 comprises logic control circuits, storage means and a microprocessor. The control unit 329 generates control signals to control various system operations such as drive motor control signals on a line 323 and head position and seek control signals on a line 328. The control signals on the line 328 provide the desired current profiles to optimally move and position the slider 313 to the desired data track on the disk 312. Read and write signals are communicated to and from the read/write heads 321 by means of a recording channel 325. In the depicted embodiment, the read/write heads 321 incorporate a MR sensor including a spin valve of the present invention.

Figure 4:
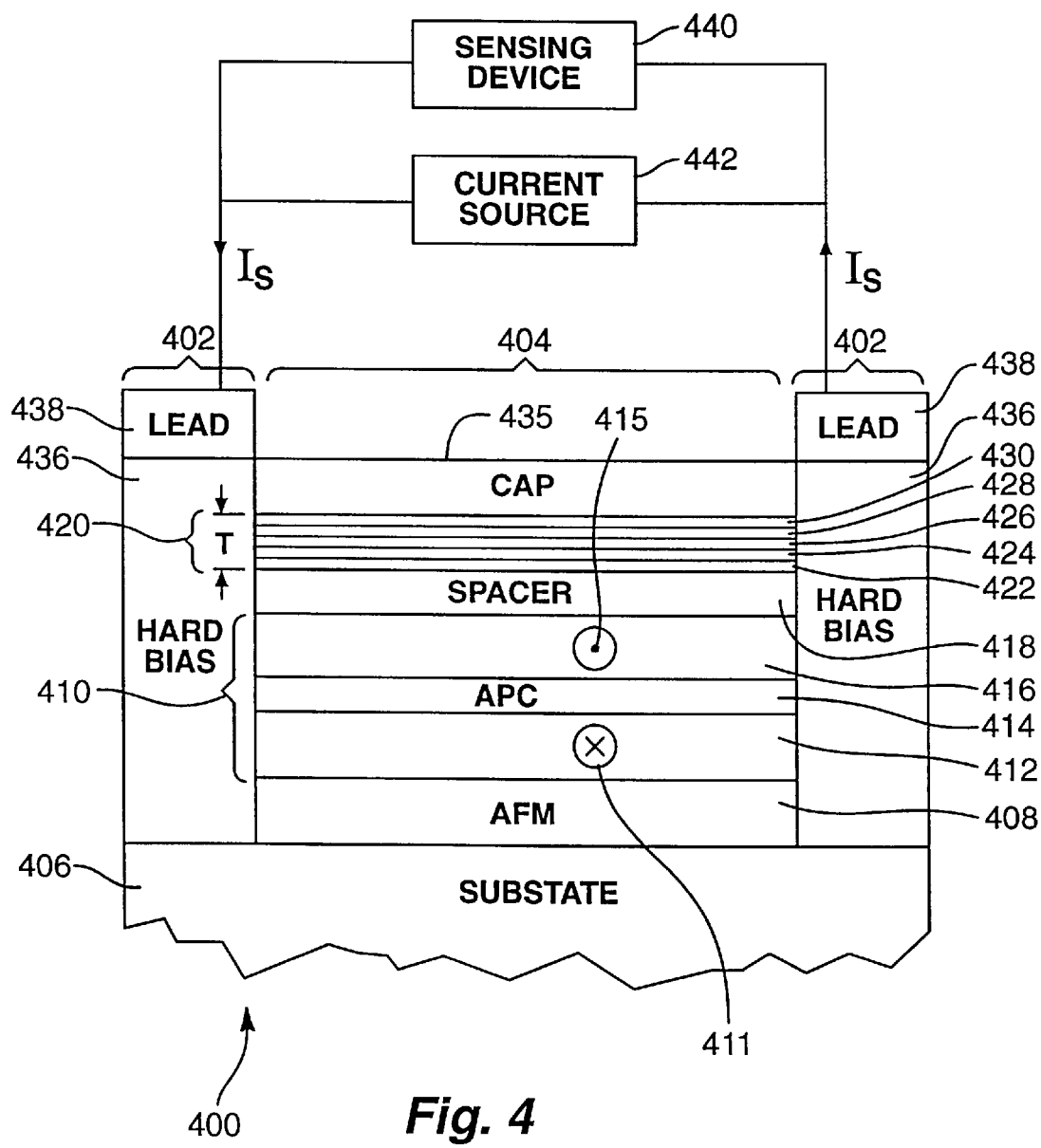
FIG. 4 is a cross-sectional view illustrating the composition of one embodiment of a spin valve sensor incorporating the improved free layer of the present invention.

FIG. 4 depicts the composition of one embodiment of a preferred spin valve 400, including an improved free layer of the present invention. FIG. 4 shows an air bearing surface (ABS) view of the SV sensor 400 according to one embodiment of the present invention. While an AP-pinned spin valve sensor 400 is depicted, and is preferred for use with the improved free layer of the present invention, nevertheless, the improved free layer of the present invention may also be used with other types of spin valve sensors, such as the simple spin valve sensor 100 of FIG. 1.

The spin valve sensor 400 of FIG. 4 is shown with a pair of end regions 402 separated from each other by a central region 404. The central region 404 has defined edges where the end regions 402 form a contiguous junction with and abut said edges. The sensor 400 is built upon a substrate 406, which may be any suitable substance, including glass, semiconductor material, or a ceramic material, such as alumina ($Al_2O_3$).

The substrate 406 may also comprise a shield layer and a gap layer as is known to those skilled in the art. An antiferromagnetic (AFM layer 408 is formed over the substrate 406 in the central region 404. Alternatively, the AFM layer 408 may be formed in both the central region 404 as well as the end regions 402. The AFM layer 408 is, in one embodiment, formed of NiO although it may also be made of other types of antiferromagnetic material such as a Ni-Mn alloy.

A laminated AP-pinned layer 410 is shown formed over the AFM layer 408. In the depicted embodiment the AP-pinned layer 410 comprises first and second AP-pinned layers 412 and 416, respectively. Alteratively, a single pinned layer, similar to layer 120 of FIG. 1 could be used in place of the AP-pinned layer 410. In the depicted embodiment, the first and second AP-pinned layers 412 and 416 are separated from each other by an anti-parallel coupling (APC) layer 414 formed of a nonmagnetic material that allows the first and second AP-pinned layers 422 and 424 to be strongly coupled antiferromagnetically.

In the depicted embodiment, the first AP-pinned layer 412 is a layer of cobalt (Co), which is deposited on and in contact with the AFM layer 408. The APC layer 414 is, in the depicted embodiment, made of ruthenium (Ru), although it may also be made of iridium (Ir), rhodium (Rh), or other suitable materials. The second AP-pinned layer 416, which is formed over and in contact with the APC layer 414, is in one embodiment formed of cobalt (Co). Preferably, the first and second pinned layers 412, 416 are pinned in opposite directions 411, 415.

The spin valve sensor 400 as depicted also includes a first spacer layer 418 which is formed over and in contact with the second AP-pinned layer 416. The first spacer layer 418 is preferably made of a GMR promoting material such as copper (Cu), although it may also be made of other GMR promoting materials such as gold (Au) or silver (Ag).

A free ferromagnetic layer 420 is shown formed over and in contact with the spacer layer 418. In order to provide the advantages of the present invention, the free layer 420 is preferably formed with a material having a high degree of magnetoresistance such as a Co-Fe alloy. Under the present invention, the free layer maintains a high degree of magnetic softness $H_K$ by laminating the Co-Fe alloy of the free layer 420 and alternating the Co-Fe alloy with an intervening material, and by keeping the alternating layers relatively thin.

In the depicted embodiment, the free layer 420 is formed with three layers of Co-Fe alloy, layers 422, 426, and 430, respectively, and two intervening metal alloy layers, layers 424 and 428. In the depicted embodiment, the intervening layers 424 and 428 are formed from NiFe, which is selected for its high magnetoresistance and low magnetostriction. The inventor has found that thin layers of alternating Co-Fe containing alloys and Ni-Fe containing alloys interact to maintain a high level of softness of the composite free layer 420, while the use of Co-Fe alloy contributes to a significantly increased magnetoresistance.

It is presumed that the thin layers of Co-Fe alloy maintain a small grain size, and that the intervening layers of Ni-Fe alloy assist in keeping the grain sizes of the Co-Fe alloy small. It is believed that this small grain size is a contributing factor to the overall softness of the free layer 420 of the present invention.

In one embodiment, the lower layer 422 of Co-Fe alloy is thicker than the other Co-Fe alloy layers 426, 430. It is believed that the interaction of the lower layer 422 with the copper (Cu) of the spacer layer 418 provides a proportionally larger contribution of the magnetoresistance of the entire free layer 420. Thus, it is preferred to keep the lower layer 422 of Co-Fe alloy relatively thick compared to the other layers 426, 430 of Co-Fe alloy.

The entire thickness of the free layer 420 is selected according to the degree of softness $H_K$ required, which is correspondingly a factor of the strength of the recorded magnetic fields of the disk drive to be sensed. As field strengths are increasingly reduced to produce higher density drives, free layer thicknesses must be correspondingly reduced in order to have a sufficient degree of softness to sense the lower strength fields. Currently, it is preferred that the free layer 420 be between 20 Å and 40 Å in thickness. As specified, however, this will continue to decrease as densities increase.

The number of alternating layers of Co-Fe alloy and intervening layers is similarly dependent upon the desired thickness of the free layer and will correspondingly vary. Figure 4 shows three layers of Co-Fe, alloy for simplicity sake, but a larger number may be used. In one embodiment, five layers are used, while 10 layers is feasible, and as high as 13 layers is thought to be advantageous.

The Co-Fe alloy layers 422, 426, 430 and the alternating layers 424, 428 are preferred to have a thickness in a range of between about 2 Å and about 15 Å. In a more preferred range, the thicknesses are in a range of between about 5 Å and about 10 Å. A presently most preferred thickness is about 7 Å.

Accordingly, in one embodiment, given by way of example, the total thickness of the free layer 420 is desired to about 40 Å. Accordingly, five total sublayers, three layers of Co-Fe alloy and two layers of NiFe, are utilized, with each layer being slightly thicker than 7 Å. Alternatively, the first layer 422 of Co-Fe alloy is slightly thicker than the others. In an example of this embodiment, the first layer 422 of Co-Fe alloy has a thickness of about 10 Å, while the other layers of Co-Fe alloy are of a thickness of about 7 Å, and the intervening layers are also of a thickness of about 7 Å. It is preferred that the thicknesses stay within the given range as free layer thicknesses vary to achieve a needed level of softness $H_K$ of the free layer 420, while the total number of layers is varied.

The intervening layers may be comprised of materials in addition to the preferred Ni-Fe alloy. For example, the addition of Co to the Ni-Fe alloy has been found to substantially increase the overall magnetoresistance of the free layer 420, while not substantially decreasing the magnetic hardness $H_K$ of the free layer 420.

Thus, in a further example, the first layer 422 of Co-Fe alloy is of a thickness of about 10 Å, and subsequent layers of Co-Fe alloy are of a thickness of about 5 Å with intervening layers comprised of a Ni-Fe-Co alloy and having a thickness of about 5 Å. In differing examples, a total of three, five, seven, nine, eleven, thirteen, and fifteen layers of alternating Co-Fe alloy and Ni-Fe-Co alloy lamination are employed to achieve thicknesses of 20 Å, 30 Å, 40 Å, etc., respectively.

A currently preferred example of the Co-Fe alloy for use in the Co-Fe alloy layers 422, 426, 430 is $Co_{90}Fe_{10}$, and a preferred example of the Ni-Fe alloy for use in the intervening layers 424, 426 is $Ni_{81}Fe_{19}$. A preferred example of the Ni-Fe-Co alloy for use in the intervening layers 424, 428 is $Ni_{66}Fe_{16}Co_{18}$.

In a further embodiment of the present invention, other materials are added to the intervening layers 424, 428 to increase the electrical resistance thereof Adding resistive materials causes a larger proportion of the applied current to pass through the Co-Fe alloy layers 422, 426, 430. Thus, due to the relatively greater magnetoresistance of the Co-Fe alloy layers 422, 426, 430, the overall magnetoresistance of the free layer 420 is increased. Examples of suitable materials for such an addition to the intervening layers 424, 428 include chromium, tantalum, rhodium, and molybdenum.

Referring again to FIG. 4, the spin valve sensor is shown with a cap layer 435 formed over the free layer 420 to protect the material deposited in the central region against oxidation. The cap layer 435 is preferably made of tantalum (Ta), but of course, any suitable material may be used.

The spin valve sensor 400 is also shown formed with a pair of longitudinal biasing layers 436, formed in the end regions 402. The biasing layers 436 are preferably made of hard material such as Co-Pt-Cr alloy and are used for longitudinally biasing the central region 404.

A pair of electrical leads 438 are also shown formed over the biasing layers 436 and are employed to form a circuit path between the spin valve sensor 400 and a current source 442 and a sensing device 440. In the preferred embodiment, magnetic signals in the recorded medium (e.g., the disk 312 of FIG. 3) are sensed by the sensing device 440 in the form of a voltage differential (voltage: signal) between the two leads 402.

The sensed voltage signal arises from a change in resistance, $\Delta R$, of the central portion 404 as the magnetization direction $M_F$ of the free layer 420 rotates in response to the applied magnetic signal from the recorded medium. The sensing device may include a digital recording channel such as a partial-response maximum likelihood (PRML) channel as is known to those skilled in the art. Alternatively, it may include a peak-detect channel as is known to those skilled in the art. In the preferred embodiment of the present invention, the sensing device included a digital recording channel of the type known in the art as partial-response maximum-likelihood.

From the above-discussion, it should be readily apparent that the improved free layer of the present invention provides the advantages of increased magnetoresistance while maintaining a high degree of softness and while exhibiting substantially no magnetostriction.

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A free layer for a spin valve sensor, comprising:
    a plurality of layers of a Co-Fe alloy; and
    at least one intervening metal alloy layer containing at least Ni, Co, and Fe separating the plurality of layers of a Co-Fe alloy.

2. The free layer of claim 1, wherein the at least one intervening metal alloy layer also comprises a metal selected from the group consisting of chromium, tantalum, rhodium, and molybdenum.

3. The free layer of claim 1, wherein the plurality of layers of a Co-Fe alloy each has a thickness falling within a range of between about 2 Angstroms and about 15 Angstroms.

4. The free layer of claim 1, wherein each of the plurality of layers of a Co-Fe alloy has a thickness falling within a range of between about 5 Angstroms and about 10 Angstroms.

5. The free layer of claim 1, wherein the plurality of layers of a Co-Fe alloy comprise a first layer of a Co-Fe alloy positioned adjacent a spacer layer, the first layer of a Co-Fe alloy having a thickness that is substantially thicker than the others of the plurality of layers of a Co-Fe alloy.

6. The free layer of claim 1, wherein the free layer has a total thickness in a range of between about 20 Angstroms and about 40 Angstroms.

7. The free layer of claim 1, wherein the plurality of layers of a Co-Fe alloy comprises at least 3 layers.

8. The free layer of claim 1, wherein the plurality of layers of a Co-Fe alloy and the at least one intervening metal alloy layer comprise:
- a first layer of a Co-Fe alloy;
- a first intervening layer of a metal alloy containing at least Ni, Fe, and Co, the first intervening layer disposed adjacent the first layer of a Co-Fe alloy;
- a second layer of a Co-Fe alloy, the second layer of a Co-Fe alloy disposed adjacent the first intervening layer;
- a second intervening layer of a metal alloy containing at least Ni, Fe, and Co, the second intervening layer disposed adjacent the second layer of a Co-Fe alloy; and
- a third layer of a Co-Fe alloy, the third layer of a Co-Fe alloy disposed adjacent the second intervening layer.

9. The free layer of claim 8, wherein the first layer of a Co-Fe alloy is positioned adjacent a spacer layer and is substantially thicker than the second and third layers of a Co-Fe alloy.

10. The free layer of claim 8, wherein the first, second, and third layers of a Co-Fe alloy comprise $Co_{90}Fe_{10}$.

11. The free layer of claim 10, wherein the first and second intervening layers comprise $Ni_{66}Fe_{16}Co_{18}$.

12. A spin valve sensor, comprising:
- a cap layer;
- a free layer of a ferromagnetic material, the free layer comprising:
  - a plurality of layers of a Co-Fe alloy; and
  - at least one intervening metal alloy layer containing at least Ni, Co, and Fe separating the plurality of layers of a Co-Fe alloy;
- a spacer layer;
- a pinned layer of ferromagnetic material, the pinned layer separated from the free layer by the spacer layer; and
- an anti ferromagnetic (AFM) layer for pinning the magnetization of the pinned layer.

13. The spin valve sensor of claim 12, wherein the at least one intervening metal alloy layer also comprises a metal selected from the group consisting of chromium, tantalum, rhodium, and molybdenum.

14. The spin valve sensor of claim 12, wherein each layer of the plurality of layers of a Co-Fe alloy has a thickness falling within a range of between about 2 Angstroms and about 15 Angstroms.

15. The spin valve sensor of claim 12, wherein each layer of the plurality of layers of a Co-Fe alloy has a thickness falling within a range of between about 5 Angstroms and about 10 Angstroms.

16. The spin valve sensor of claim 13, wherein the plurality of layers of a Co-Fe alloy comprise a first layer of a Co-Fe alloy positioned adjacent the spacer layer, the first layer of a Co-Fe alloy having a thickness that is substantially thicker than the others of the plurality of layers of a Co-Fe alloy.

17. The spin valve sensor of claim 12, wherein the plurality of layers of a Co-Fe alloy comprises at least 5 layers.

18. The spin valve sensor of claim 12, wherein the plurality of layers of a Co-Fe alloy and the at least one intervening metal alloy layer comprise:
- a first layer of a Co-Fe alloy;
- a first intervening layer of a metal alloy containing at least Ni, Co, and Fe, the first intervening layer disposed adjacent the: first layer of a Co-Fe alloy;
- a second layer of a Co-Fe alloy, the second layer of a Co-Fe alloy disposed adjacent the first intervening layer;
- a second intervening layer of a metal alloy containing at least Ni, Co, and Fe, the second intervening layer disposed adjacent the second layer of a Co-Fe alloy; and
- a third layer of a Co-Fe alloy, the third layer of a Co-Fe alloy disposed adjacent the second intervening layer.

19. The spin valve sensor of claim 18, wherein the layers of a Co-Fe alloy comprise $Co_{90}Fe_{10}$.

20. The spin valve sensor of claim 18, wherein the first and second intervening layers each comprise $Ni_{66}Fe_{16}Co_{18}$.

21. The spin valve sensor of claim 18, wherein the pinned layer comprises a first pinned sublayer and a second pinned sublayer separated by an antiparallel coupling sublayer.

22. The spin valve sensor of claim 18, wherein the first layer of a Co-Fe alloy is substantially thicker than the second and third layers of a Co-Fe alloy.

23. A spin valve sensor, comprising:
- a cap layer;
- a free layer adjacent the cap layer, the free layer comprising
- a first layer of a Co-Fe alloy;
- a first intervening layer comprising a metal alloy containing at least Ni and Fe;
- a second layer of a Co-Fe alloy;
- a second intervening layer comprising a metal alloy containing at least Ni and Fe;
- a third layer of a Co-Fe alloy;
- a spacer layer adjacent the free layer;
- at least one pinned layer adjacent the spacer layer; and
- an antiferromagnetic layer adjacent the at least one pinned layer.

24. The spin valve sensor of claim 23, wherein the first and second intervening layers further comprise Co, and wherein the layers of a Co-Fe alloy have a thickness of less than about 10 Angstroms.

25. A disk drive system, comprising:
- a magnetic recording disk;
- an anti-parallel-pinned spin valve sensor for reading data recorded on the recording disk, comprising:
  - a cap layer; a free layer adjacent the cap layer, the free layer comprising
    - a first layer of a Co-Fe alloy;
    - a first intervening layer comprising a metal alloy containing at least Ni and Fe;
    - a second layer of a Co-Fe alloy;
    - a second intervening layer comprising a metal alloy containing at least Ni and Fe;
    - a third layer of a Co-Fe alloy;
    - a spacer layer adjacent the free layer;
    - at least one pinned layer adjacent the spacer layer; and
    - an antiferromagnetic layer adjacent the at least one pinned layer;
- an actuator for moving said spin valve sensor across the magnetic recording disk so the spin valve sensor may access different regions of magnetically recorded data on the magnetic recording disk; and a detector electrically coupled to the spin valve sensor for detecting changes in resistance of the sensor caused by rotation of the magnetization axis of the free ferromagnetic layer relative to the fixed magnetizations of the AP-pinned layer in response to magnetic fields from the magnetically recorded data.

26. The disk drive system of claim 25, wherein the layers comprising a metal alloy containing at least Ni and Fe further comprise Co, and wherein the layers of a Co-Fe alloy have a thickness of less than about 10 Angstroms.

* * * * *

UNITED STATES PATENT AND TRADEMARK OFFICE
CERTIFICATE OF CORRECTION

Figure 1:
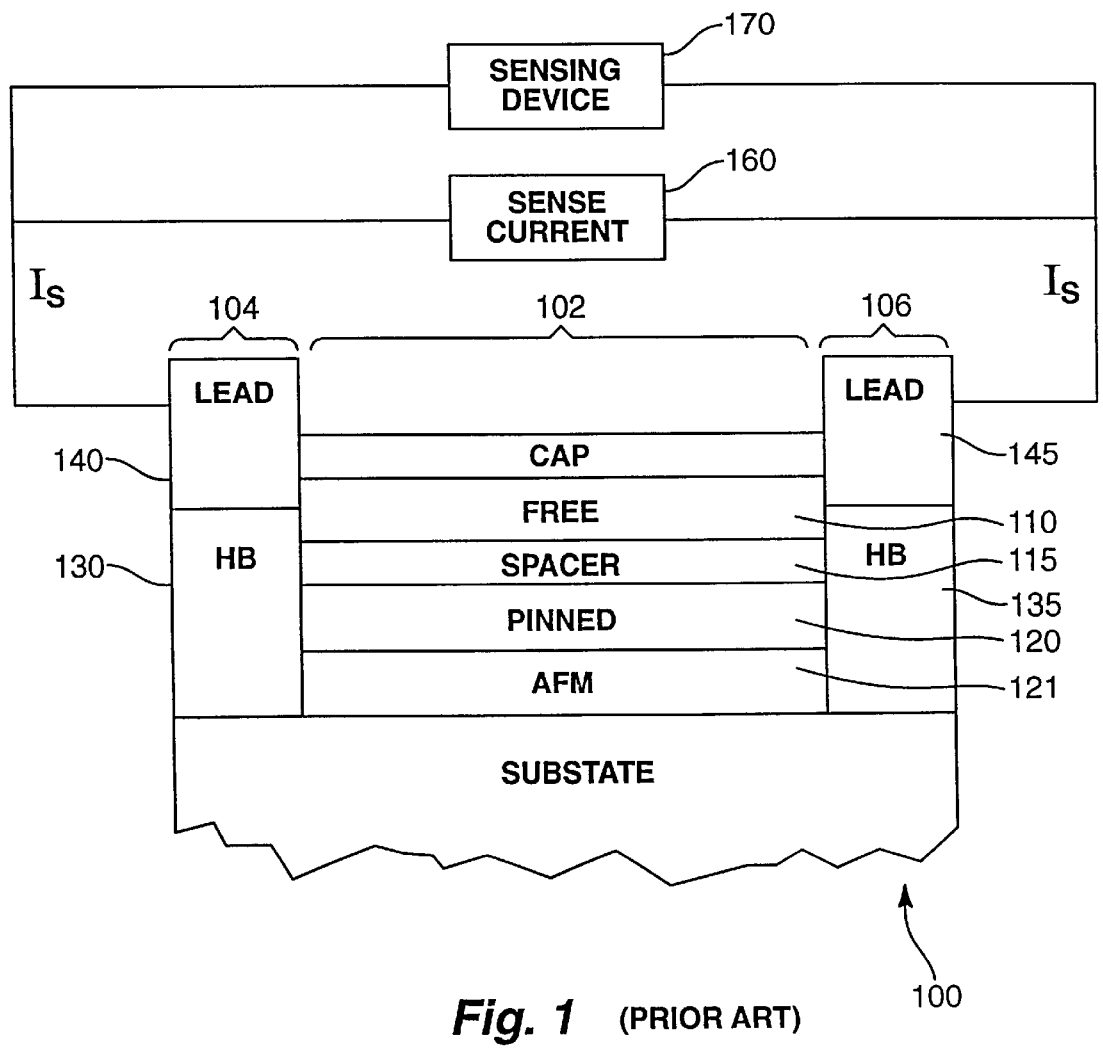
FIG. 1 is a cross-sectional view illustrating the composition of a spin valve sensor of the prior art.
Figure 2:
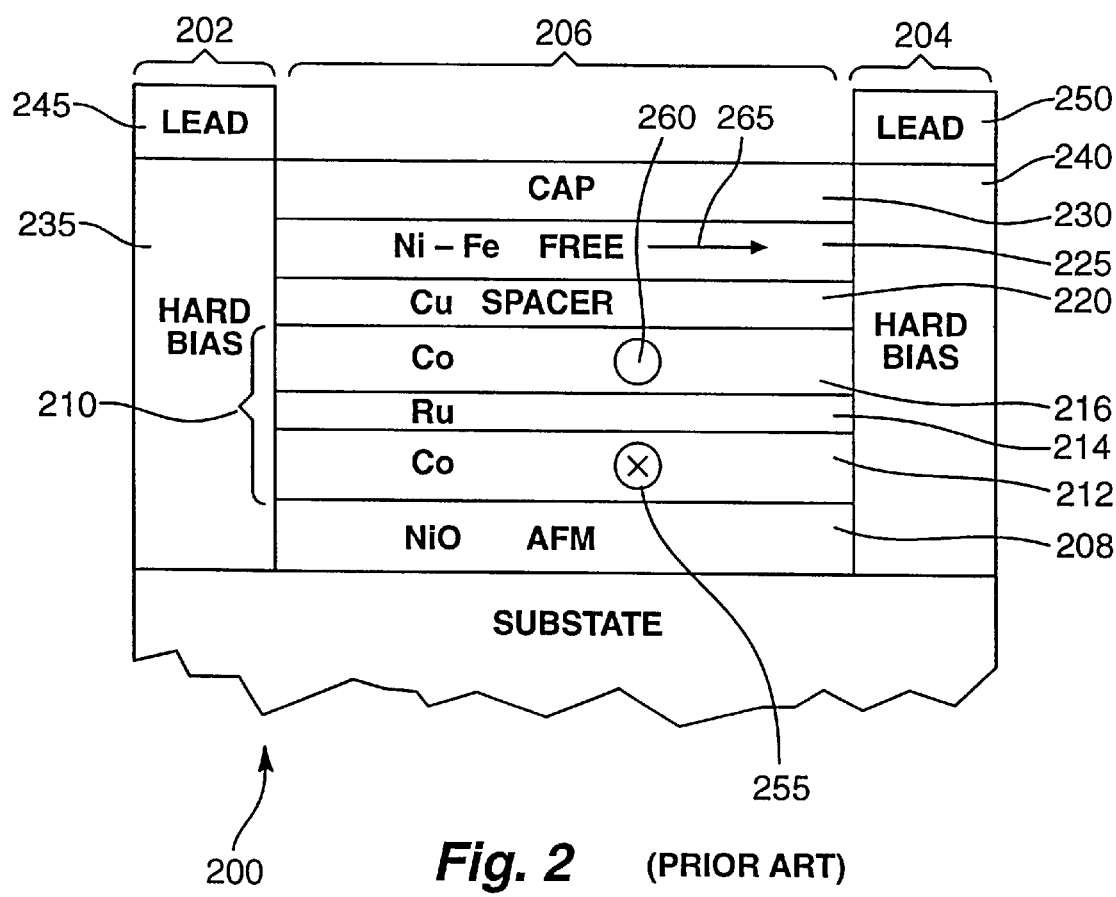
FIG. 2 is a cross-sectional view illustrating the composition of an AP-pinned spin valve sensor of the prior art.

PATENT NO.    : 6,466,417 B1                                              Page 1 of 1
DATED         : October 15, 2002
INVENTOR(S)   : Hardayal Singh Gill It is certified that error appears in the above-identified patent and that said Letters Patent is hereby corrected as shown below:

Drawings,
Figure 1, "SUBSTATE" should read -- SUBSTRATE --.
Figure 2, "SUBSTATE" should read -- SUBSTRATE --.
Figure 4, Number 406, "SUBSTATE" should read -- SUBSTRATE --.

Column 7,
Line 17, "Figure 4" should read -- FIG. 4 --.
Line 64, "thereof" should read -- thereof. --.

Column 10,
Line 7, "the:" should read -- the --.

Signed and Sealed this

Eighteenth Day of February, 2003

JAMES E. ROGAN
*Director of the United States Patent and Trademark Office*